United States Patent [19]

Asano

[11] Patent Number: 5,596,223
[45] Date of Patent: Jan. 21, 1997

[54] SEMICONDUCTOR DEVICE AND METHOD OF SELECTING THE SAME

[75] Inventor: Kazunori Asano, Tokyo, Japan

[73] Assignee: NEC Corporation, Tokyo, Japan

[21] Appl. No.: 651,128

[22] Filed: May 21, 1996

Related U.S. Application Data

[63] Continuation of Ser. No. 357,758, Dec. 16, 1994, abandoned.

[30] Foreign Application Priority Data

Dec. 16, 1993 [JP] Japan ................................ 5-317006

[51] Int. Cl.$^6$ ................ H01L 23/12; H01L 21/66; H01L 23/52
[52] U.S. Cl. .............. 257/620; 257/796; 257/717; 257/707; 437/226
[58] Field of Search ................................. 257/706, 707, 257/717, 720, 796, 620; 437/226

[56] References Cited

U.S. PATENT DOCUMENTS

| | | | |
|---|---|---|---|
| 4,577,398 | 3/1986 | Sliwa et al. | 257/772 |
| 4,876,588 | 10/1989 | Miyamoto | 257/707 |
| 4,965,659 | 10/1990 | Sasame et al. | 257/720 |
| 5,250,845 | 10/1993 | Runyan | 257/712 |
| 5,324,981 | 6/1994 | Kobiki et al. | 257/620 |
| 5,338,967 | 8/1994 | Kosaki | 257/706 |
| 5,457,072 | 10/1995 | Tamaki et al. | 437/326 |

FOREIGN PATENT DOCUMENTS

| | | |
|---|---|---|
| 59-88843 | 5/1984 | Japan . |
| 59-215739 | 12/1984 | Japan . |

*Primary Examiner*—Sara W. Crane
*Assistant Examiner*—Alexander Oscar Williams
*Attorney, Agent, or Firm*— Foley & Lardner

[57] ABSTRACT

A semiconductor device has a plated heat sink structure. The plated heat sink structure includes an Ni-plating layer.

5 Claims, 3 Drawing Sheets

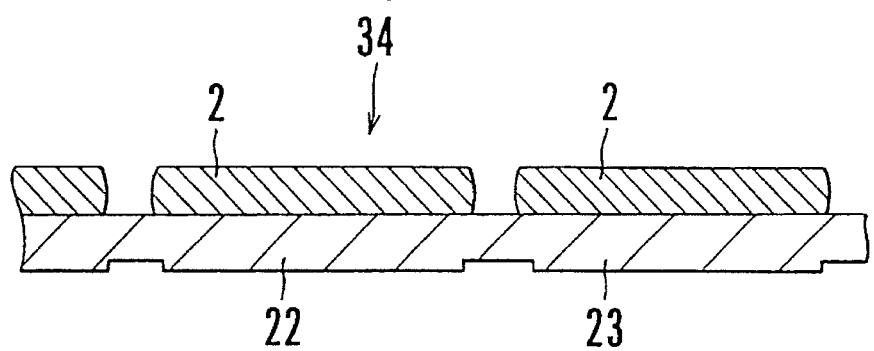
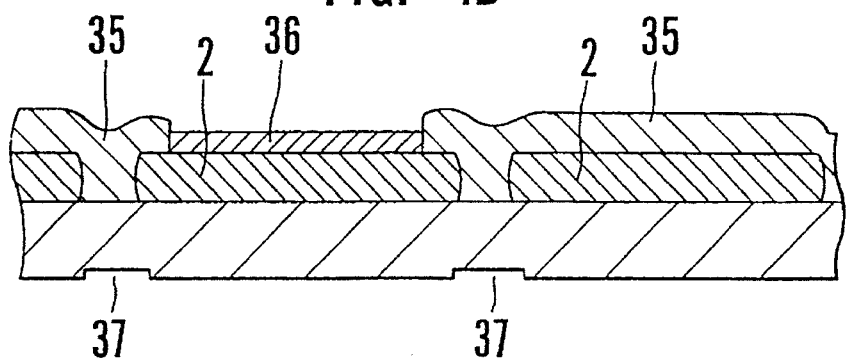
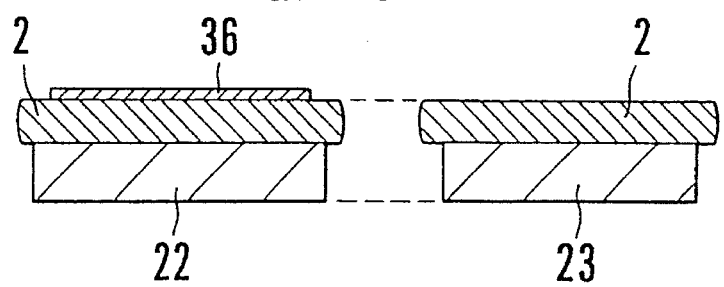
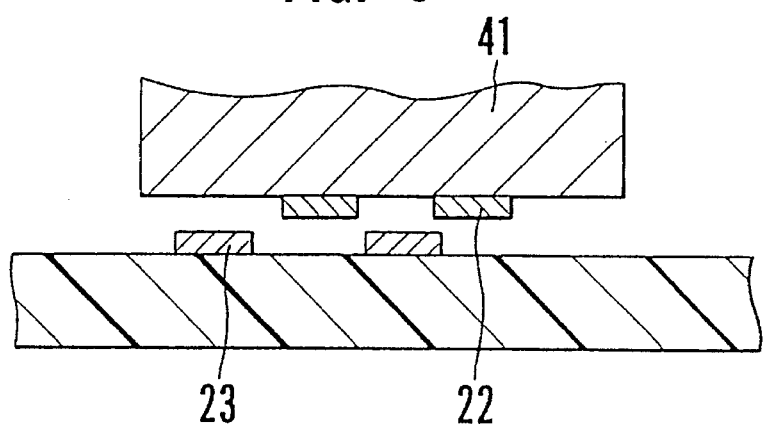

SEMICONDUCTOR DEVICE AND METHOD OF SELECTING THE SAME

This application is a continuation of application Ser. No. 08/357,758, filed Dec. 16, 1994 now abandoned.

BACKGROUND OF THE INVENTION

1. Field of the Invention

The present invention relates to a semiconductor device and a method of selecting the same and, more particularly, to a semiconductor device having a PHS (Plated Heat Sink) structure and a method of selecting specific kind of chips from a semiconductor substrate with the PHS structure including several kinds of chips.

2. Description of the Prior Art

Conventionally, in manufacturing a high-output semiconductor device having a PHS structure, product chips (a chip having a practical signal processing function is called a product chip so as to be distinguished from a TEG chip to be described later upon completion of a semiconductor device) obtained by dividing a wafer into chips selected using tweezers or the like. This method, however, has bad workability, and requires a large number of steps. Particularly, when one wafer includes several kinds of product chips and TEG (Test Element Group, i.e., an evaluation element group for checking the element characteristics of, e.g., a transistor in a wafer) chips, selection by outer appearances must be performed using a microscope or the like to distinguish specific product chips from others, undesirably increasing the number of selection steps.

In order to solve the above problem and decrease the number of selection steps, a method of sticking a ferromagnetic adhesive tape on unnecessary chips, and a method of coating a ferromagnetic ink on unnecessary chips, and magnetically selecting and removing the coated chips are available (e.g., see Japanese Unexamined Patent Publication Nos. 59-88843 and 59-215739). FIGS. 1A and 1B show these selection methods described in these prior arts. FIG. 1A shows a state wherein a ferromagnetic adhesive tape 52 is stuck on the surface of a semiconductor chip 51 as a rejection mark, and FIG. 1B shows a selection state. Referring to FIG. 1B, an acceptable semiconductor chip 53 and a rejected semiconductor chip 54 are conveyed on a belt 55, and a magnet 56 selects and removes only the rejected semiconductor chip 54.

By using the above selection method, an unnecessary chip can be easily, effectively removed. However, when one wafer includes several kinds of product chips, and only a specific kind of chips are to be selected from these chips at a non-defective product level without damage, the magnetic tape cannot be stuck on the surfaces of the chips, or the magnetic ink cannot be coated thereon, as a matter of course. Although a method of attaching these materials on the lower surfaces of the chips can be considered, the magnetic material causes a circuit operation error on chips using transistors such as GaAs FET. Therefore, this method cannot be properly applied to product chips.

SUMMARY OF THE INVENTION

The present invention has been made in consideration of the above problem in selection by the conventional technique, and has as its object to provide a semiconductor device and a method of selecting the same, by which only a specific kind of product chips are easily selected from a wafer with a PHS structure including several kinds of product chips without damaging the chips and adversely affecting the characteristics, thereby increasing the workability.

In order to achieve the above object, according to the first aspect of the present invention, there is provided a semiconductor device having a plated heat sink structure, wherein the plated heat sink structure comprises an Ni-plating layer.

According to the second aspect of the present invention, there is provided a semiconductor device, described in the first aspect, wherein an Au-plating layer is further formed on the Ni-plating layer.

According to the third aspect of the present invention, there is provided a method of selecting a semiconductor device by which, in selection of a specific kind of semiconductor chips from a semiconductor substrate with a plated heat sink structure including several kinds of semiconductor chips, only the specific kind of semiconductor chips subjected to selection are caused to have a structure described in the first aspect, and upon dividing the semiconductor substrate into semiconductor chips, the semiconductor chips subjected to selection are attracted and selected by a magnet.

According to the present invention having the above aspects, the time, of e.g., 1 hour, required in a conventional selection operation using tweezers or the like can be shortened to about 5 minutes. Unlike the methods of attaching the magnetic tape and the magnetic mark on the surfaces of chips, magnetic selection can be performed without mechanically, electromagnetically damaging element characteristics, thereby effectively improving the workability.

The above and other advantages, features and additional objects of the present invention will become manifest to those versed in the art upon making reference to the following detailed description and accompanying drawings in which preferred embodiments incorporating the principle of the present invention are shown by way of illustrative example.

BRIEF DESCRIPTION OF THE DRAWINGS

FIGS. 4A to 4C are sectional views along the line IV—IV of FIG. 3B sequentially showing the manufacturing steps according to the embodiment of the present invention, respectively; and FIG. 5 is an explanatory view showing a method of selecting a chip according to the present invention.

DETAILED DESCRIPTION OF PREFERRED EMBODIMENT

Figure 1A:
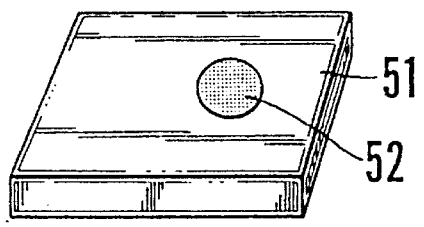
FIG. 1A is a schematic perspective view for explaining a conventional method of selecting a semiconductor chip.
Figure 1B:
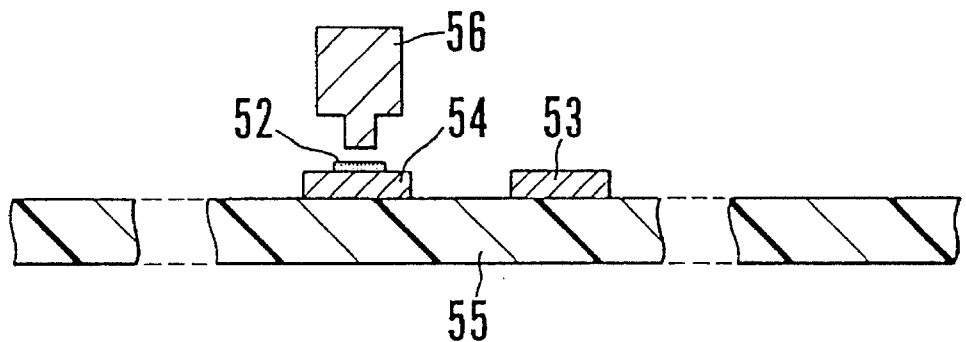
FIG. 1B is a sectional view illustrating a selecting device for performing the conventional method.
Figure 2A:
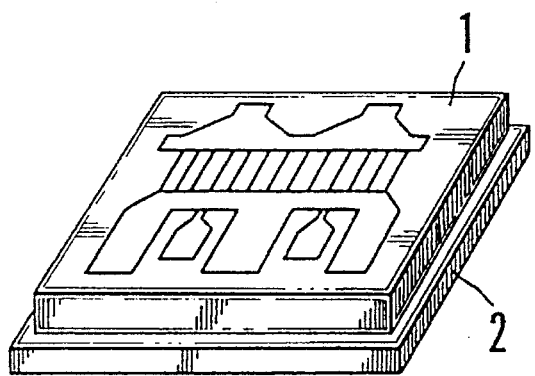
FIGS. 2A and 2B are perspective views showing the upper and lower portions of a semiconductor device according to an embodiment of the present invention, respectively.
Figure 2B:
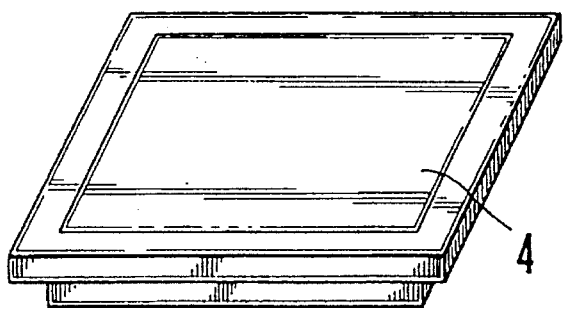

A preferred embodiment of the present invention will be described below with reference to the accompanying drawings. FIG. 2A is a perspective view showing a semiconductor chip when viewed obliquely from the top according to the embodiment of the present invention, and FIG. 2B is a perspective view thereof when viewed obliquely from the bottom. Referring to FIGS. 2A and 2B, a semiconductor chip 1 has a PHS 2, and an Ni-plating layer 4 formed on the lower surface of the PHS 2.

Figure 3A:
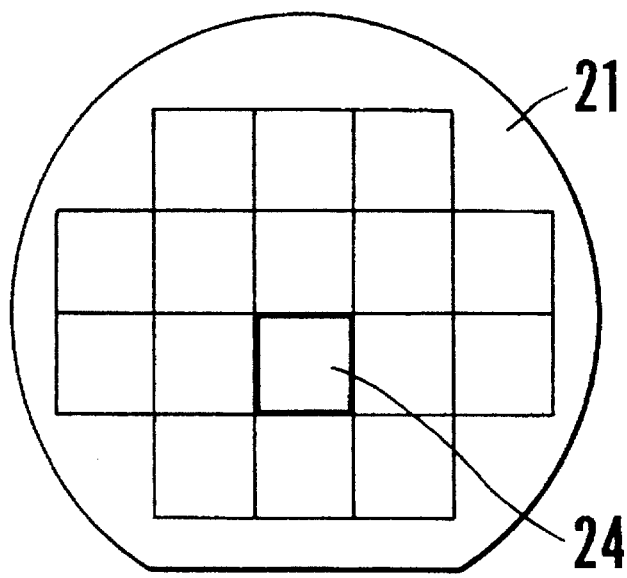
FIG. 3A is a plan view showing the upper surface representing a chip arrangement on a wafer according to the embodiment of the present invention.
Figure 3B:
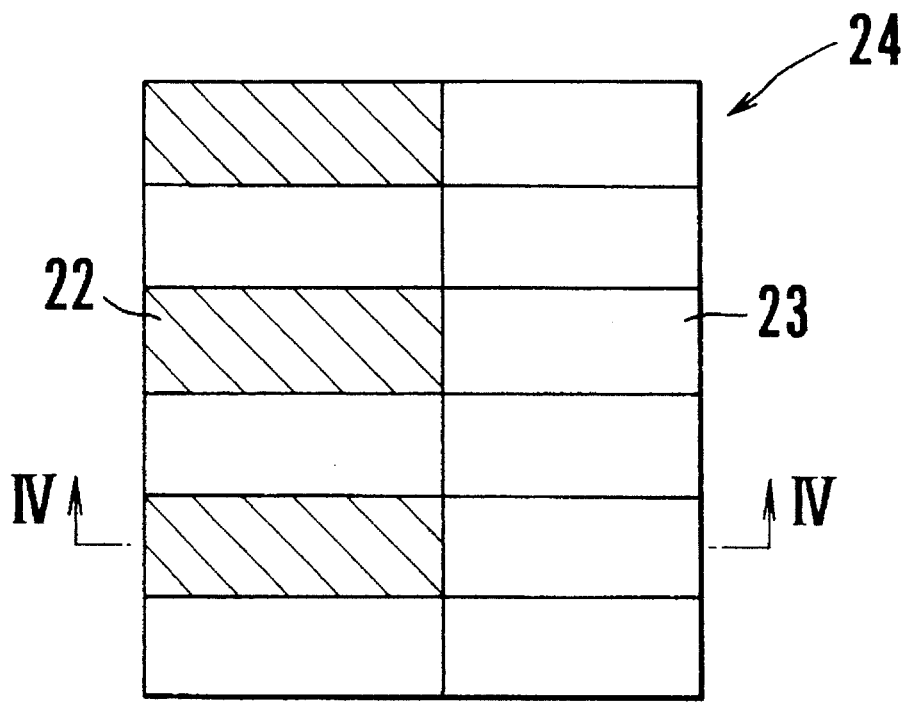
FIG. 3B is a partial enlarged view thereof.

FIGS. 3A and 3B are views showing the state wherein a wafer includes the chips having the structure shown in FIGS. 2A and 2B and normal PHS chips, and FIG. 3B is a partial enlarged view of FIG. 3A. Referring to FIGS. 3A and 3B, blocks 24 are arranged, as a repetition unit, in a two-dimensional array on a semiconductor wafer 21. As shown in the enlarged view of FIG. 3B, each block 24 includes three product chips 22 represented as hatched portions and nine product chips 23 having a type different from that of the product chips 22. In this embodiment, only the product chips 22 are to be extracted from the wafer. As shown in FIG. 2B, Ni is plated on the PHS portion of each product chip 22.

FIGS. 4A to 4C are views showing a method of manufacturing the semiconductor chip in FIGS. 2A and 2B, and sectional views sequentially showing the manufacturing steps along the line IV—IV of the block 24 in FIG. 3B. Referring to FIGS. 4A to 4C, first of all, Au is plated on the lower surface of the semiconductor wafer 21 in the normal manufacturing step to form the PHS 2 having a thickness of, e.g., 30 μm. The PHS (Au plating) 2 of each product chip 23 which is not subjected to selection is masked with a photoresist 35, and Ni plating 36 is performed to a thickness of, e.g., 5 μm on the PHS of each product chip 22 subjected to selection (FIG. 4B). Finally, a scribed portion 37 is cut by etching to separate the chips from each other (FIG. 4C).

FIG. 5 is a sectional view illustrating the selection process of this embodiment. An electromagnet 41 is moved close to the separated chips, and only the required product chip 22 is extracted.

This embodiment has exemplified the structure wherein the surface of the plating layer formed on the PHS portion is exposed. If a step of, upon formation of the Ni-plating layer 4, forming an Au-plating layer on the resultant structure is further added, Ni is prevented from being exposed on the PHS surface. Therefore, a semiconductor device can be formed to have the same effect as that described in the above embodiment without degrading the mounting ability of the chips.

What is claimed is:

1. A plurality of semiconductor chips formed on a semiconductor substrate, said plurality of semiconductor chips comprising:

at least one group of first semiconductor chips, at least one group of second semiconductor chips, and a plurality of plated heat sink structures formed at respective rear surfaces of said semiconductor chips, each of said plated heat sink structures formed at respective rear surfaces of said at least one group of first semiconductor chips comprising a nickel-plating layer for allowing said at least one group of first semiconductor chips to be selected from among said at least one group of second semiconductor chips without damaging said semiconductor chips and adversely affecting characteristics thereof and, each of said plated heat sink structures formed at respective rear surfaces of said at least one group of second semiconductor chips not comprising any nickel-plating layer.

2. The semiconductor chips as claimed in claim 1, wherein an Au-plating layer is further formed on said nickel-plating layer.

3. The semiconductor chips as claimed in claim 1, wherein said plurality of semiconductor chips are formed on one wafer.

4. The semiconductor chips as claims in claim 1, wherein each of said at least one group of first semiconductor chips are selected by an electromagnet placed in proximity to said semiconductor substrate such that only each of said at least one group of first semiconductor chips are drawn toward said electromagnet.

5. A method for selecting at least one group of first semiconductor chips from a plurality of semiconductor chips which also include at least one group of second semiconductor chips, comprising the steps of:

a) forming plated heat structures at respective rear surfaces of each of said plurality of semiconductor chips, said plated heat structures for said at least one group of first semiconductor chips including a nickel-plating layer, said plated heat structures for said at least one group of second semiconductor chips not including the nickel-plating layer; and b) placing an electromagnet in proximity to said semiconductor chips so as to select said at least one group of semiconductor chips from said plurality of semiconductor chips due to attraction of said at least one group of semiconductor chips towards said electromagnet.

* * * * *